United States Patent [19]

Ishibashi et al.

[11] Patent Number: 5,151,754
[45] Date of Patent: Sep. 29, 1992

[54] METHOD AND AN APPARATUS FOR MEASURING A DISPLACEMENT BETWEEN TWO OBJECTS AND A METHOD AND AN APPARATUS FOR MEASURING A GAP DISTANCE BETWEEN TWO OBJECTS

[75] Inventors: Yoriyuki Ishibashi, Kawasaki; Ryoichi Hirano, Tokyo; Jun Nishida, Yokohama, all of Japan

[73] Assignee: Kabushiki Kaisha Toshiba, Kawasaki, Japan

[21] Appl. No.: 593,871

[22] Filed: Oct. 5, 1990

[30] Foreign Application Priority Data

Oct. 6, 1989 [JP] Japan .................................. 1-261568
Feb. 5, 1990 [JP] Japan .................................. 2-25836

[51] Int. Cl.⁵ .............................................. G01B 11/02
[52] U.S. Cl. .................................... 356/356; 356/349; 250/548
[58] Field of Search ................ 356/349, 356, 399; 250/548

[56] References Cited

U.S. PATENT DOCUMENTS

| | | | |
|---|---|---|---|
| 4,838,693 | 6/1989 | Uchida et al. | 356/356 |
| 4,848,911 | 7/1989 | Uchida et al. | 356/356 |
| 4,902,133 | 2/1990 | Tojo et al. | 356/356 |
| 4,988,197 | 1/1991 | Ishibashi et al. | 356/349 |

FOREIGN PATENT DOCUMENTS

| | | |
|---|---|---|
| 2451333 | 5/1976 | Fed. Rep. of Germany . |
| 2451994 | 11/1976 | Fed. Rep. of Germany . |
| 3715864 | 11/1987 | Fed. Rep. of Germany . |
| 62-261003 | 11/1987 | Japan . |

Primary Examiner—Samuel A. Turner
Assistant Examiner—LaCharles P. Keesee
Attorney, Agent, or Firm—Oblon, Spivak, McClelland, Maier & Neustadt

[57] ABSTRACT

A method and an apparatus for measuring a displacement between two objects. Corresponding pairs of regions of the two objects each have at least one diffraction grating which generate two-dimensionally distributed diffracted light beams. These light beams are diffracted and caused to interfere with each other in the paired regions, whereby two-dimensionally distributed diffracted interference light beams are emitted. A light beam of a specific order is detected from each of these diffracted interference light beams, and is converted into a beat signal. The displacement is obtained in accordance with the phase difference between these beat signals.

33 Claims, 16 Drawing Sheets

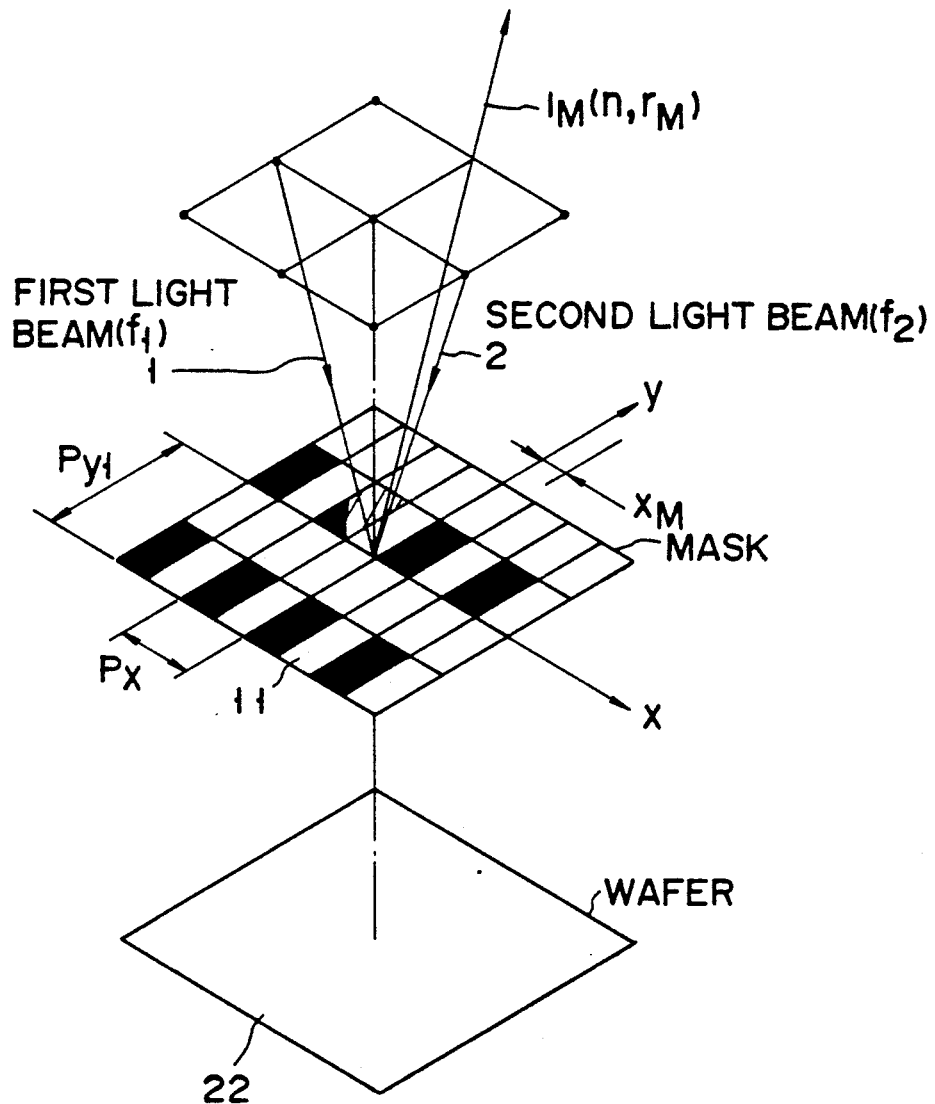
F I G. 9

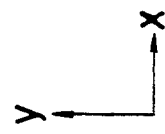
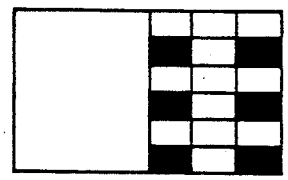 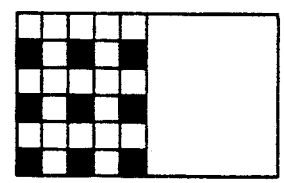
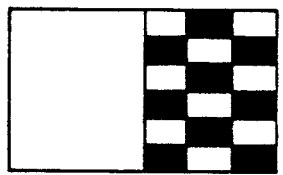 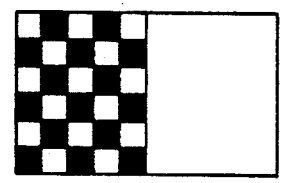
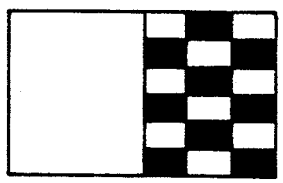 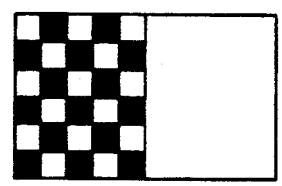
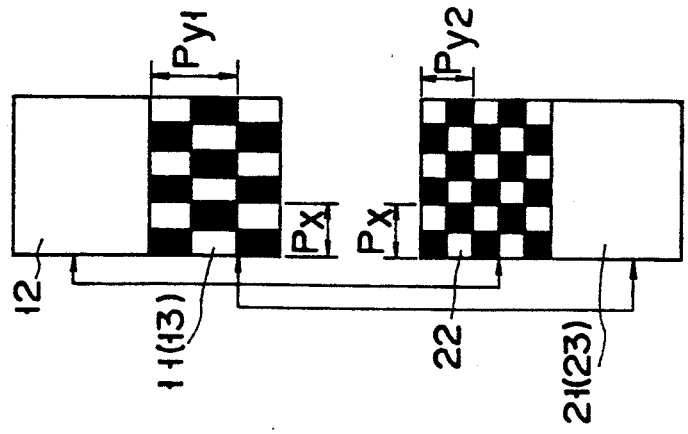
F I G. 13a   F I G. 13b   F I G. 13c   F I G. 13d

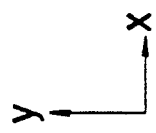
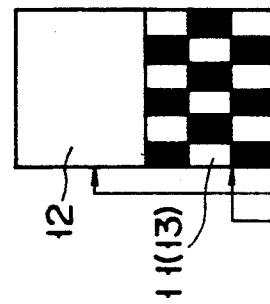 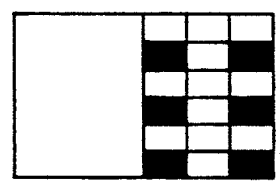  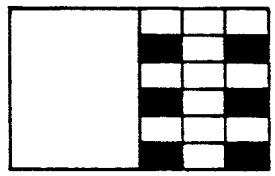
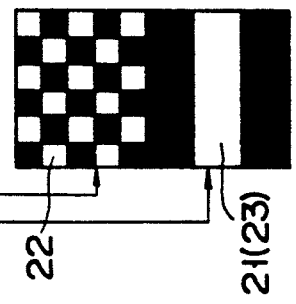 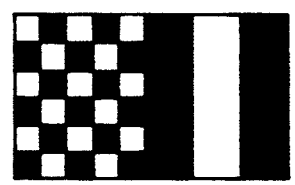 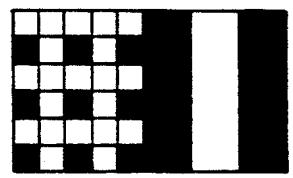 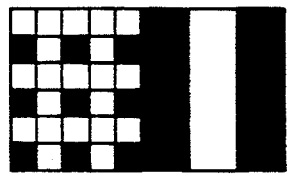
FIG. 14a   FIG. 14b   FIG. 14c   FIG. 14d

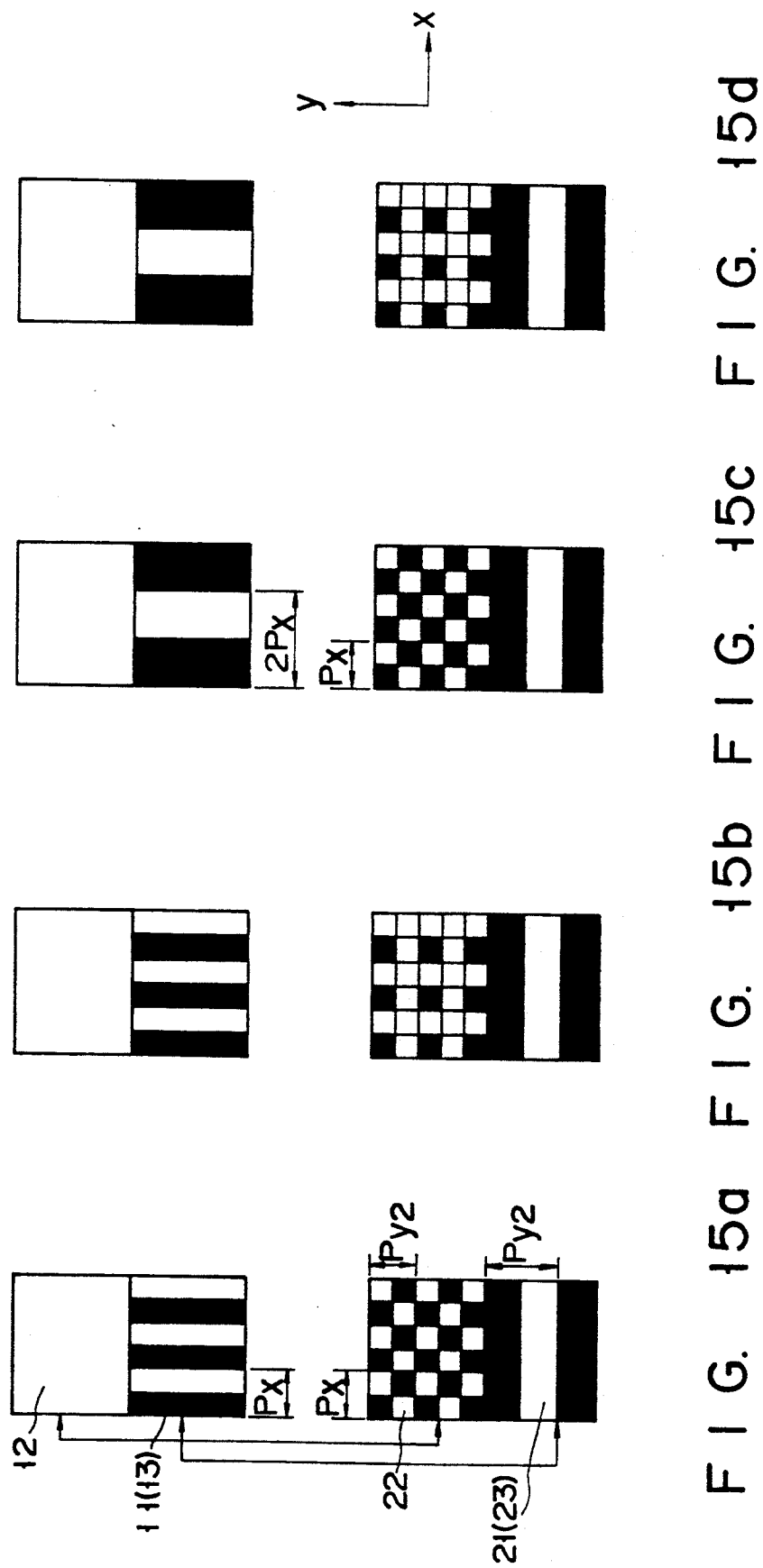

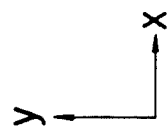
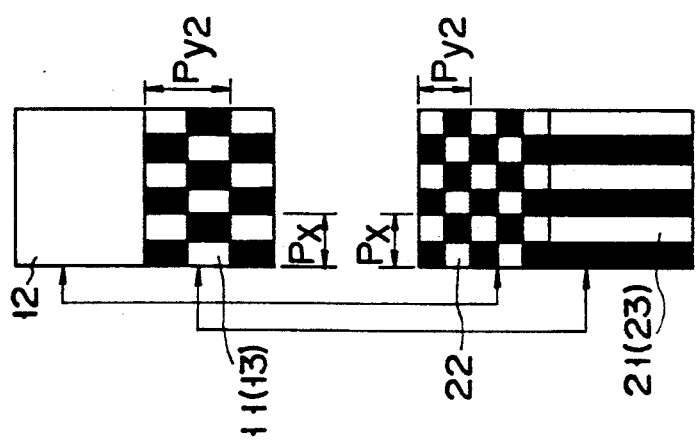
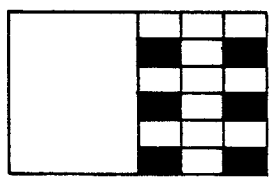 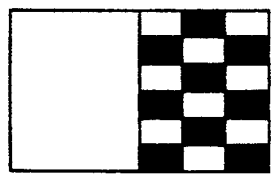 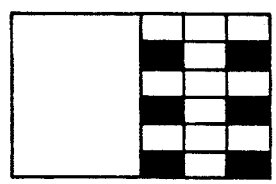
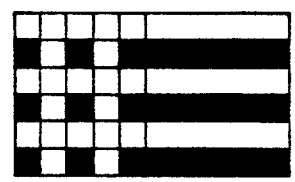 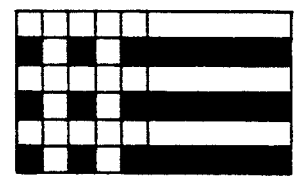 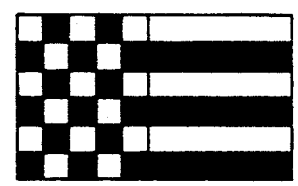
F I G. 16a   F I G. 16b   F I G. 16c   F I G. 16d

METHOD AND AN APPARATUS FOR MEASURING A DISPLACEMENT BETWEEN TWO OBJECTS AND A METHOD AND AN APPARATUS FOR MEASURING A GAP DISTANCE BETWEEN TWO OBJECTS

BACKGROUND OF THE INVENTION

1. Field of the Invention

The present invention relates to a method and an apparatus for measuring a displacement between two objects and a method and an apparatus for measuring a gap distance between two objects. More particularly, the invention relates to a method and an apparatus for measuring a displacement between a mask and a wafer for relative alignment between them, in an exposure apparatus for the manufacture of semiconductors, and also to a method and an apparatus for measuring a gap distance between a mask and a wafer for relative alignment between them, in an exposure apparatus.

2. Description of the Related Art

In the process of manufacturing a semiconductor device such as a VLSI, an exposure apparatus transfers the circuit pattern of the device onto a wafer. In an X-ray exposure apparatus, in particular, X-rays are applied to the wafer through a mask having the circuit pattern, thereby transferring the image of the pattern onto the wafer. In order to transfer the circuit pattern onto the wafer, it is necessary to align the mask and the wafer, which face each other, in their facing direction, and to provide a desired gap between them.

A method and an apparatus for executing the alignment, gap setting, and relative alignment with relatively high accuracy are disclosed in, for example, Published Unexamined Japanese Patent Application No. 62-261003. In this proposed method or apparatus, relative alignment is effected by the optical heterodyne interference method using one-dimensional diffraction gratings. According to this method, the mask is provided with a one-dimensional diffraction grating and a window, and the wafer with a reflecting surface and another one-dimensional diffraction grating.

First, the alignment is executed. In doing this, two laser light beams individually having frequencies f1 and f2 are applied in the ±1-order direction to the one-dimensional diffraction grating of the mask. These light beams are transmitted through the one-dimensional diffraction grating of the mask to be diffracted thereby, reflected by the reflecting surface of the wafer, and transmitted again through the one-dimensional diffraction grating of the mask to be diffracted thereby. Thereupon, the light beams are changed into diffracted interference light beams $I_M$, thus appearing distributed one-dimensionally. The light beams transmitted through the window of the mask, on the other hand, are transmitted through the one-dimensional diffraction grating of the wafer to be diffracted thereby, and transmitted again through the window of the mask, thus appearing as diffracted interference light beams $I_W$ distributed one-dimensionally. The phase difference $\Delta\phi_X$ between light beams of $I_M(0, 0)$ and $I_W(0, 0)$ orders, out of the diffracted interference light beams $I_M$ and $I_W$, is detected. Since the phase difference $\Delta\phi_X$ corresponds to a displacement between the mask and the wafer, the displacement can be determined by calculation. The mask and the wafer are aligned on the basis of this determined displacement.

Subsequently, the gap setting between the mask and the wafer is executed. In doing this, the light beam with the frequency f1 is incident in the +1-order direction, as in the case of the alignment, while the light beam with the frequency f2 is incident in the +3-order direction. Thereupon, a light beam of $I_W(-2, 0)$ order is detected which is diffracted and caused to interfere with each other on the same optical path for the alignment. The phase difference $\Delta\phi_Z$ between the light beams of $I_W(-2, 0)$ and $I_M(0, 0)$ orders is detected. Since the phase difference $\Delta\phi_Z$ corresponds to the gap distance between the mask and the wafer, the gap distance can be determined by calculation. The predetermined gap is set between mask and the wafer on the basis of this determined gap distance. More specifically, a gap z may be expressed as follows:

$$z = Zp^2/\pi\lambda,$$

where $Z = \frac{1}{8} \cdot (\Delta\phi_Z + 2X)$, $X = 2\pi\Delta x/p$, p is the pitch of the diffraction grating, and $\lambda$ is the wavelength of the light.

Thus, the displacement and the gap can be measured in accordance with the phase differences, and the alignment and the gap setting can be executed on the basis of the measured values.

According to this method, the diffraction grating formed on each of the mask and the wafer is a one-dimensional diffraction grating which has a plurality of parallel stripes extending at right angles to the aligning direction, so that the diffracted light beams are one-dimensionally distributed in the aligning direction. Further, the respective diffraction gratings of the mask and the wafer are deviated from each other in the direction perpendicular to the aligning direction, so that the diffracted light beam of $I_W(-2, 0)$ order appears in close vicinity to the diffracted light beam of $I_M(-2, 0)$ order which is generated simultaneously therewith. More specifically, these two diffracted light beams are emitted at a very short distance of about 100 μm from each other, and partially overlap and interfere with each other. Accordingly, the diffracted light beam of $I_W(-2, 0)$ order cannot be detected selectively and separately from the diffracted light beam of $I_M(-2, 0)$ order. If the light beam of $I_W(-2, 0)$ order is detected interfering with the light beam of $I_M(-2, 0)$ order, therefore, the gap between the mask and the wafer cannot be set with high accuracy.

SUMMARY OF THE INVENTION

An object of the present invention is to provide a method and an apparatus for measuring a displacement, in which diffracted interference light beams to be detected can be detected selectively and separately without applying three light beams independently to diffraction gratings of the two objects, so that the displacement between the objects can be measured with high accuracy without depending o the distance of a gap between them.

Another object of the invention is to provide a method and an apparatus for measuring a gap distance, in which the distance of a gap between two objects can be measured with high accuracy without regard to the presence of a displacement between the objects.

A displacement measuring method according to the present invention, in which a first object has at least two regions, and a second object has at least two regions formed corresponding individually to the regions of the first object, each of the corresponding pairs of regions of the first and second objects having at least one diffraction grating such that an emitted light beam is changed into two-dimensionally distributed diffracted light beams after being transferred to the paired regions, comprises steps of: emitting a first light beam having a frequency f1 and a second light beam having a frequency f2 (f1≠f2) from light source means; transferring the two light beams to the two regions of the first or second object, and then causing the light beams to be diffracted and interfere with each other in the corresponding pairs of regions of the first and second objects so that at least first and second two-dimensionally distributed diffracted interference light beams are emitted; detecting a light beam of a specific order from the first diffracted interference light beams and converting the detected light beam into a first beat signal having a frequency $\Delta f (= |f1-f2|)$, and at the same time, detecting another light beam of another specific order, identical with or different from the first specific order, from the second diffracted interference light beams and converting the detected light beam into a second beat signal having the frequency $\Delta f (= |f1-f2|)$; and calculating the phase difference between the first and second beat signals, thereby obtaining the displacement between the first and second objects which corresponds to the phase difference.

Another displacement measuring method according to the invention, in which a first object has at least two regions, and a second object has at least two regions formed corresponding individually to the regions of the first object, each of the corresponding pairs of regions of the first and second objects having at least one diffraction grating such that an emitted light beam is changed into two-dimensionally distributed diffracted light beams after being transferred to the paired regions, comprises steps of: emitting a first light beam having a frequency f1 and a second light beam having a frequency f2 (f1≠f2) from light source means; transferring the two light beams to the two regions of the first or second object, and then causing the light beams to be diffracted and interfere with each other in the corresponding pairs of regions of the first and second objects so that at least two two-dimensionally distributed diffracted interference light beams are emitted; detecting a light beam of a specific order from at least one of the diffracted interference light beams and converting the detected light beam into a beat signal or detection signal having a frequency $\Delta f (= |f1-f2|)$ and involving a phase shift corresponding to the displacement between the first and second objects; generating a third light beam having the frequency f1 and a fourth light beam having the frequency f2, the third and fourth light beams being of the same phase as the first and second light beams before the diffraction and interfering with each other; detecting the third and fourth light beams and converting the detected light beams into a beat signal or reference signal having the frequency $\Delta f$ and involving no phase shift corresponding to the displacement between the first and second objects; and calculating the phase difference between the detection signal and the reference signal to obtain the phase shift, thereby obtaining the displacement.

A gap distance measuring method according to the invention, in which a first object has at least two regions, and a second object has at least two regions formed corresponding individually to the regions of the first object, each of the corresponding pairs of regions of the first and second objects having at least one diffraction grating such that an emitted light beam is changed into two-dimensionally distributed diffracted light beams after being transferred to the paired regions, comprises steps of: emitting two light beams individually having frequencies f1 and f2 (f1≠f2) from light source means; transferring the two light beams to the two regions of the first or second object, and then causing the light beams to be diffracted and interfere with each other in the corresponding pairs of regions of the first and second objects so that at least first and second two-dimensionally distributed diffracted interference light beams are emitted; detecting a light beam of a specific order from the first diffracted interference light beams and converting the detected light beam into a first beat signal having a frequency $\Delta f (= |f1-f2|)$, and at the same time, detecting another light beam of another specific order, identical with or different from the first specific order, from the second diffracted interference light beams and converting the detected light beam into a second beat signal having the frequency $\Delta f (= |f1-f2|)$; and calculating the phase difference between the first and second beat signals, thereby obtaining the gap distance between the first and second objects which corresponds to the phase difference.

According to the present invention, each of the corresponding pairs of regions of the first and second objects have at least one diffraction grating such that the emitted light beam is changed into two-dimensionally distributed diffracted light beams after being transferred to the paired regions. Therefore, the diffracted interference light beams diffracted and caused to interfere with each other by the corresponding pairs of regions of the first and second objects appear distributed two-dimensionally.

Accordingly, the two specific-order light beams of the diffracted interference light beams used for the displacement measurement are emitted at a relatively long distance from each other. Thus, these individual specific-order light beams can be detected selectively and independently of each other, that is, separately from the other light beams, so that the displacement between the mask and the wafer can be measured without depending on the gap distance between them.

Further, the two specific-order light beams of the diffracted interference light beams used for the gap measurement are also emitted at a relatively long distance from each other. Thus, these individual specific-order light beams can be separately selected, so that the gap distance between the mask and the wafer can be measured without regard to the presence of the displacement between them.

The specific order of the light beam detected in order to obtain the first beat signal may be identical with or different from that of the light beam detected in order to obtain the second beat signal.

One of the two specific-order light beams for the displacement measurement may be identical with the one of the two specific-order light beams for the gap measurement.

A two-dimensional diffraction grating having a checkered pattern is used as the diffraction grating for changing the emitted light beam into the two-dimensionally distributed diffracted light beams. In this case, the "checkered pattern" is not limited to a pattern formed of square checkers, and must only be formed of rectangular checkers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9 to 12 are diagrams showing diffraction gratings for two-dimensionally distributing the diffracted light beams;

FIGS. 13a to 16d are diagrams showing combinations of diffraction gratings disposed in two regions of the mask and two regions of the wafer;

FIGS. 18A–18D are graphs showing the relationships between a phase shift and the displacement, both obtained experimentally.

DETAILED DESCRIPTION OF THE PREFERRED EMBODIMENTS

Referring now to FIGS. 1 to 4, a first embodiment of the present invention will be described.

Figure 1:
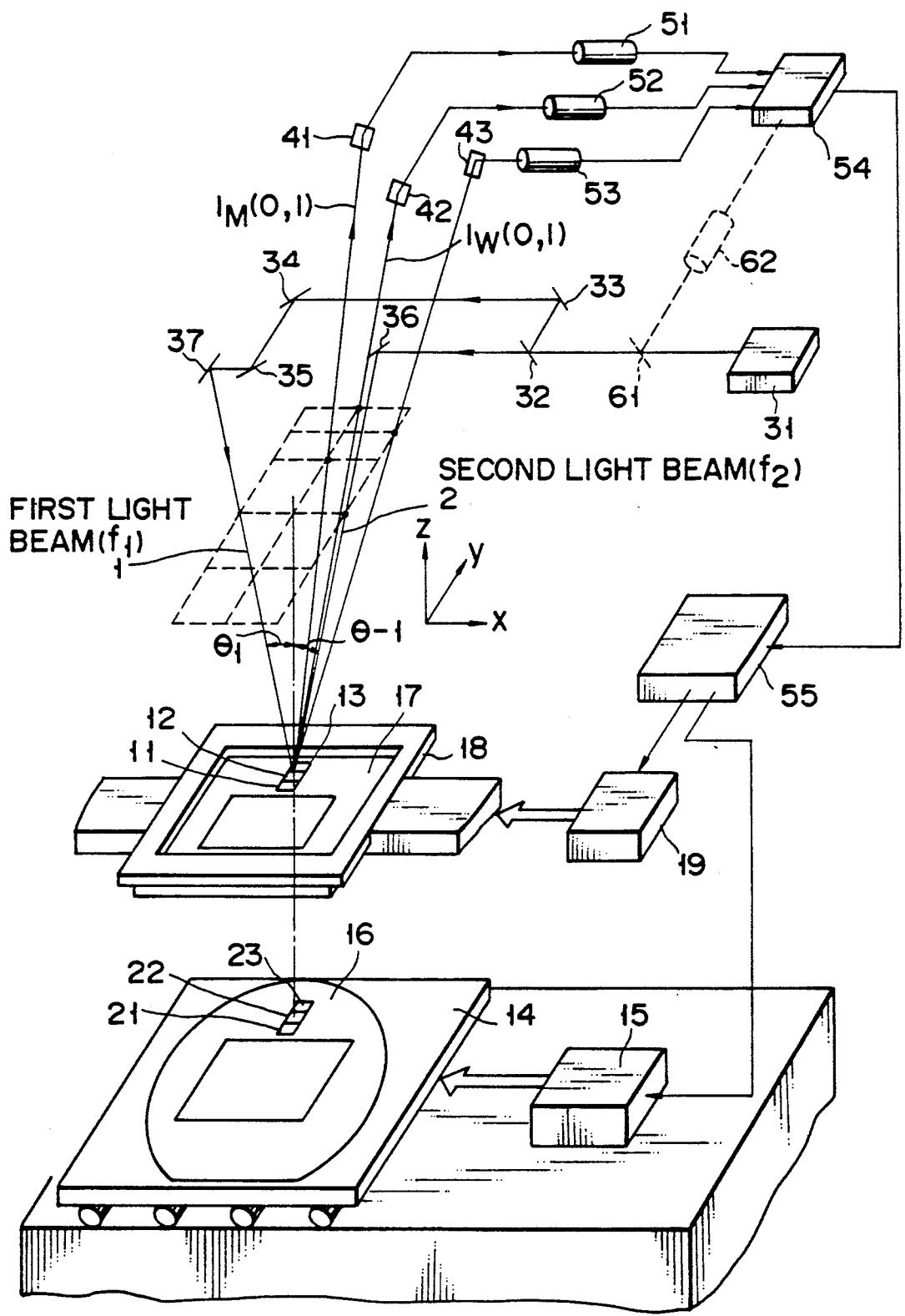
FIG. 1 is a schematic perspective view of an apparatus according to an embodiment of the present invention, which is used to align a mask and a wafer in an X-ray exposure apparatus.

FIG. 1 shows a relative alignment apparatus according to a first embodiment of the present invention, adapted for alignment and gap setting between a mask and a wafer in an X-ray exposure apparatus. Here let it be supposed that one direction in a horizontal plane is the x-direction, the direction perpendicular to the x-direction within the horizontal plane is the y-direction, and the vertical direction is the z-direction. In this embodiment, the mask and the wafer are aligned with each other in the x-direction.

The relative alignment apparatus is provided with a wafer stage 14 movable in the x-direction. An actuator 15 for driving the stage 14 is connected to the stage. A wafer 16 is placed on the stage 14, and a mask 17 is located over the wafer so that a predetermined gap distance in the z-direction is kept between the two. The mask 17 is held by means of a mask holder 18, which is connected to an actuator 19, e.g., a piezoelectric device, which moves the holder 18 in the z-direction.

Figure 2:
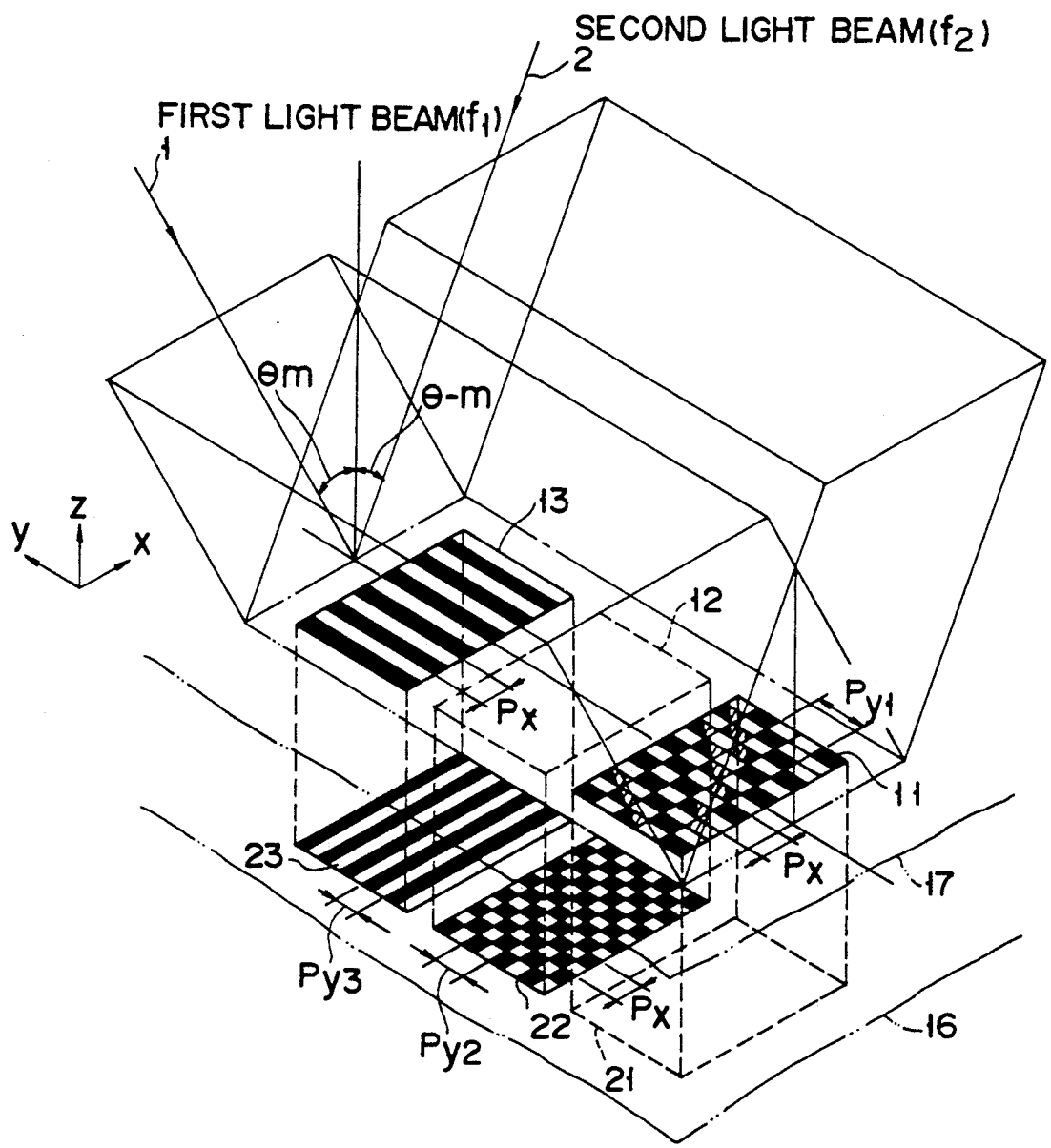
FIG. 2 is a schematic perspective view showing diffraction gratings formed on the mask and the wafer.

As shown in FIG. 2, regions 11, 12 and 13 are defined at predetermined positions on the mask 17, while regions 21, 22 and 23 are defined at predetermined positions on the wafer 16 so as to face their corresponding mask regions.

A two-dimensional diffraction grating of a checkered pattern, having a pitch $p_{y1}$ in the y-direction, is disposed in the region 11, a transmission surface or window is disposed in the region 12, and a one-dimensional diffraction grating, having a striped pattern extending in the y-direction, is disposed in the region 13. A mirror surface as a reflecting surface is formed in the region 21, a two-dimensional diffraction grating of a checkered pattern, having a pitch $p_{y2}$ in the y-direction, is disposed in the region 22, and a one-dimensional diffraction grating, having a striped pattern extending in the x-direction and arranged with a y-direction pitch $p_{y3}$, is disposed in the region 23.

With respect to the x-direction, all these diffraction gratings are arranged with the same pitch $p_x$. The relationships between the y-direction pitches are given by $p_{y3} > p_{y1} > p_{y2}$. Thus, although two-dimensionally distributed diffracted light beams of the same order appear in the same position with respect to the x-direction, they can appear in different positions with respect to the y-direction. Namely, the narrower the pitch, the greater the diffraction angle is, with respect to the y-direction. More specifically, the diffraction angle of the diffracted light beams from the checkered-pattern diffraction grating of the region 22 with the pitch $p_{y2}$ is the greatest, the diffraction angle of the diffracted light beams from the one-dimensional diffraction grating of the region 23 with the pitch $p_{y3}$ is the next greatest, and the diffraction angle of the diffracted light beams from the checkered-pattern diffraction grating of the region 11 with the pitch $p_{y1}$ is the smallest.

The so-called optical heterodyne interference method is used for displacement measurement and gap distance measurement according to the present invention. The following is a description of the principle of this method.

According to this method, a phase shift $\phi$ of diffracted interference light beams, produced when two light beams of frequencies f1 and f2 are diffracted and caused to interfere with each other by the diffraction gratings, is proportional to the displacement of the mask or the wafer. Therefore, the phase shift $\phi$ is obtained to determine the displacement.

Figure 3:
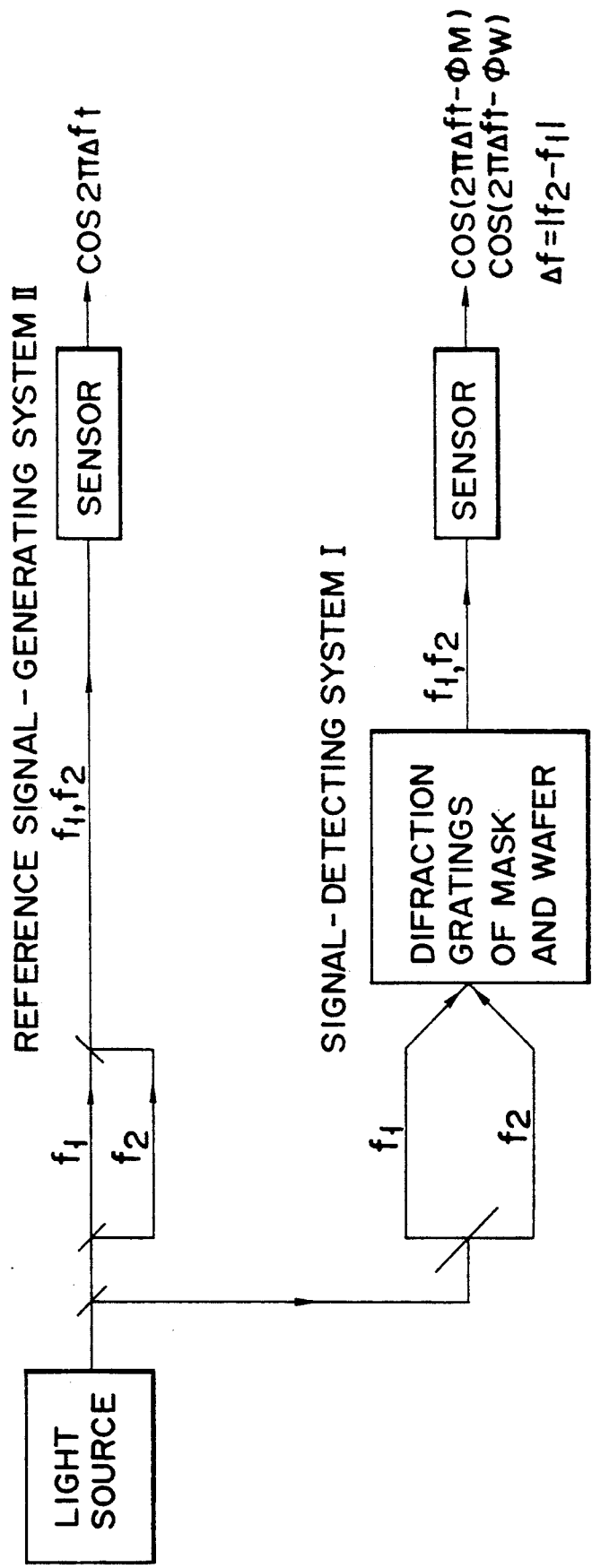
FIG. 3 is a diagram for illustrating the optical heterodyne interference method.

More specifically, as shown in FIG. 3, a light beam emitted from a light source is split into two light beams individually having frequencies f1 and f2 by means of a polarization beam splitter, in a detecting system I for obtaining a detection signal. When these two light beams are incident on the diffraction gratings of the mask or the wafer, they are diffracted, and at the same time, synthesized and caused to interfere with each other, by the diffraction grating. As a result, the two light beams individually having the frequencies f1 and f2 are changed into two diffracted interference light beams each having the frequencies f1 and f2. A phase shift $\phi_M$ or $\phi_W$, which is proportional to the displacement of the mask or the wafer, is produced between two light beams of a specific interference order, out of the diffracted interference light beams. These two specific-order light beams are detected by means of a sensor, and are converted into two beat signals, i.e., detection signals. These detection signals, which have a frequency $\Delta f (= |f1-f2|)$, are subject to the phase shift $\phi_M$ or $\phi_M$ with respect to the phase of the light beam emitted from the light source. Thus, the phase of the detection signals can be expressed as $\cos(2\pi\Delta ft-\phi_M)$ or $\cos(2\pi\Delta ft-\phi_W)$, where t is time.

Accordingly, the displacement between the mask and the wafer can be obtained by calculating the phase difference $|\phi_M-\phi_W|$ between the two detection signals.

As shown in FIG. 3, moreover, a reference system II may be provided to obtain a reference signal. In this reference system II, the light beam emitted from the light source is split into two light beams individually having the frequencies f1 and f2 by means of a polarization filter. Thereafter, these two light beams are synthesized into an interference light beam. This interference light beam is detected by means of a sensor, and is converted into a beat signal, i.e., a reference signal. This reference signal has the frequency $\Delta f (= |f1-f2|)$, and its phase is identical with that of the light beam emitted from the light source. Thus, the phase of the reference signal can be expressed as $\cos(2\pi\Delta ft)$. When the phase shift $\phi_M$ or $\phi_W$ of the diffracted interference light beams with respect to the reference signal is calculated, the displacement of the mask or the wafer with respect to the incident light beam can be obtained, that is, the displacement between the mask and the wafer can be measured indirectly.

The apparatus shown in FIG. 1 comprises an optical system to which the optical heterodyne interference method is applied. In this optical system, a light beam emitted from a laser beam source 31 of a Zeeman-effect type is split into two light beams, a first light beam 1 having the frequency f1 and a second light beam 2 having the frequency f2 (f1≠f2), by means of a polarization beam splitter 32. These light beams 1 and 2 are applied to the regions 11 to 13 of the mask at angles $\sin\theta_m = m\lambda/p_x$ and $\sin\theta_{-m} = -m\lambda/p_x$ (where m is a positive integer), respectively, to the z-axis via mirrors 33 to 37.

The light beams 1 and 2 incident on the region 11 of the mask are transmitted through the checkered-pattern diffraction grating of the region 11 to be diffracted and, at the same time, caused to interfere with each other. Then, they are reflected by the mirror surface of the region 21, and are transmitted again through the checkered-pattern diffraction grating of the region 11 to be diffracted. Thereupon, these light beams are changed into first diffracted interference light beams $I_M$, which are two-dimensionally distributed and emitted.

The light beams 1 and 2 with the frequencies f1 and f2 incident on the region 12 are transmitted through the window of the region 11 and, at the same time, caused to interfere with each other. Then, they are reflected to be diffracted by the checkered-pattern diffraction grating of the region 22, and are transmitted again through the window of the region 22. Thereupon, these light beams are changed into second diffracted interference light beams $I_W$, which are two-dimensionally distributed and emitted.

Likewise, the light beams 1 and 2 with the frequencies f1 and f2 incident on the region 13 are transmitted through the one-dimensional diffraction grating of the region 13 to be diffracted and, at the same time, caused to interfere with each other, as shown in FIG. 2. Then, they are reflected to be diffracted by the one-dimensional diffraction grating of the region 23, and are transmitted again through the diffraction grating of the region 13 to be diffracted. Thereupon, these light beams are changed into third diffracted interference light beams $I_G$, which are two-dimensionally distributed and emitted.

Figure 4:
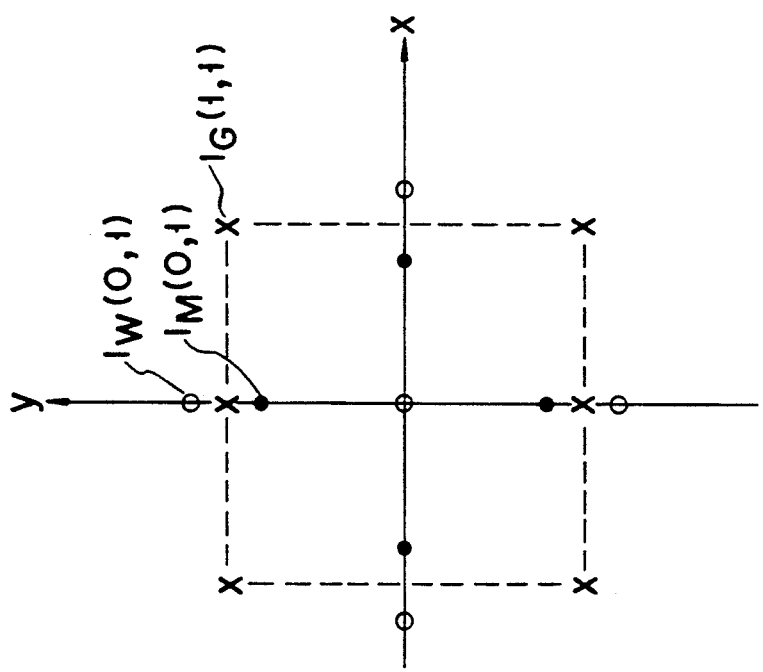
FIG. 4 is a diagram showing two-dimensional distribution of diffracted interference light beams diffracted and caused to interfere with each other by diffraction gratings.

As the two light beams 1 and 2 having the frequencies f1 and f2 are applied in this manner, a set of two-dimensionally distributed diffracted interference light beams $I_M$, $I_W$ and $I_G$ are emitted. Namely, the diffracted interference light beams $I_M$, $I_W$ and $I_G$ are emitted individually in different two-dimensional coordinate systems. In FIG. 4, which illustrates the two-dimensional distribution of these interference light beams, black spots, circles, and crosses represent the first, second, and third diffracted interference light beams $I_M$, $I_W$ and $I_G$, respectively. Only diffracted light beams of low orders not higher than ±1 order are shown in FIG. 4, and high-order ones are omitted therein.

Among the first diffracted interference light beams $I_M$, a light beam of (0, ±1) order is an optical beat which has the frequency $\Delta f (= |f1-f2|)$ and is subject to the phase shift $\phi_M$ proportional to the displacement of the mask. Among the second diffracted interference light beams $I_W$, a light beam of (0, ±1) order is an optical beat which has the frequency $\Delta f (= |f1-f2|)$ and is subject to the phase shift $\phi_W$ proportional to the displacement of the wafer. Among the third diffracted interference light beams $I_G$, a light beam of (±1, ±1) order is an optical beat which has the frequency $\Delta f (= |f1-f2|)$ and is subject to a phase shift $\phi_G$ proportional to the gap distance between the mask and the wafer.

As mentioned before, the light beams $I_M$, $I_W$ and $I_G$ are distributed two-dimensionally, and the light beams $I_M$ and $I_W$ are produced by means of the checkered-pattern diffraction gratings, so that diffracted light beams of $I_M$(±1, ±1) order and $I_W$(±1, ±1) order cannot be produced. Thus, diffracted light beams $I_G$(±1, ±1) order can be detected selectively and separately from the other ones.

Since the relationships between the y-direction pitches of the diffraction gratings are given by $p_{y3} > p_{y1} > p_{y2}$, moreover, the diffraction angles of the light beams $I_M$, $I_W$ and $I_G$ are different, and the individual diffracted light beams are emitted at relatively long distances from one another. As shown in FIG. 1, therefore, the diffracted light beams of $I_M$(0, ±1) and $I_W$(0, ±1) orders are detected selectively and separately from the other ones. Light beams of $I_M$(0, 1), $I_W$(0, 1), and $I_G$(1, 1) orders are guided via mirrors 41, 42 and 43 to sensors 51, 52 and 53, respectively, to be detected thereby. Thereupon, these light beams are converted individually into first, second, and third beat signals having the frequency $\Delta f$ and phase shifts $\phi_M$, $\phi_W$, and $\phi_G$, respectively. These first to third beat signals are applied to a phase meter 54, whereby their phase differences are calculated.

The gap distance between the mask and the wafer can be measured by calculating a phase difference $\Delta\phi_Z$ between the first and third beat signals $I_M(0, 1)$ and $I_G(1, 1)$. In this case, the first beat signal $I_M(0, 1)$ is subject to no phase shift corresponding to the gap, and serves as a reference signal for the third beat signal $I_G(1, 1)$. At the same time, the phase shift between the mask and the wafer can be obtained by calculating a phase difference $\Delta\phi_X$ between the first and second beat signals $I_M(0, 1)$ and $I_W(0, 1)$.

The phase differences $\Delta\phi_X$ and $\Delta\phi_Z$ may be calculated with use of an alternative arrangement indicated by broken line in FIG. 1. This arrangement comprises a beam splitter 61 for splitting the light beam emitted from the laser beam source and an optical system 62. In the optical system 62, the light beam reflected by the splitter 61 is split into two light beams individually having the frequencies f1 and f2 (f1≠f2) by means of a polarization filter, and the split light beam is converted into a beat signal as a reference signal. The phase shift $\phi_M$ or $\phi_W$ of phase diffracted interference light beams corresponding to this reference signal is calculated by means of the phase meter 54, and the phase difference $\Delta\phi_X$ or $\Delta\phi_Z$ is calculated on the basis of the phase shift.

The phase difference $\Delta\phi_Z$ or $\Delta\phi_X$ calculated by either of the aforementioned two calculating methods is applied to the input of a CPU 55, whereupon a control signal is delivered from the CPU 55 to the actuator 19 so that the phase difference $\Delta\phi_Z$ is set at a predetermined value. As a result, the mask 17 is moved so that the gap distance between the mask 17 and the wafer 16 is adjusted to a predetermined value, while a control signal is delivered from the CPU 55 to the actuator 15 so that the phase difference $\Delta\phi_X$ is set at predetermined value (e.g., zero). Thus, the wafer stage 14 is moved to adjust the position of the wafer 14, whereby the mask 17 and the wafer 16 are aligned with each other.

In this case, the phase difference $\Delta\phi_Z$, which is proportional to the gap distance, may be given by $\Delta\phi_Z = (\pi^2 \sin 2Z - 2\sin 8Z)/(2 + \pi^2 \cos 2Z + 2\cos 8Z)$, where $Z = \pi\lambda z/p_x^2$.

This phase difference $\Delta\phi_Z$ is a function which does not include the displacement but includes only the gap distance Z. Accordingly, the gap distance can be independently determined without regard to the presence of the displacement by measuring the phase difference $\Delta\phi_Z$.

The intensities $I_M(0, 1)$ and $I_W(0, 1)$ of the diffracted light beams of $I_M(0, 1)$ and $I_W(0, 1)$ orders may be expressed as follows:

$$I_M(0, 1) \propto 2/\pi^4\{4r^2 + r(t/2 + 2r) \cdot (1 + \cos 2Z)\} \cdot \cos(2\pi\Delta f \cdot t - 2X_M),$$

$$I_W(0, 1) \propto 2AB\cos(2\pi\Delta f \cdot t - 2X_W),$$

where t and r are the amplitude transmittance and reflectivity, respectively, of the diffraction gratings of the mask, $X_M$ is a displacement of the mask with respect to the incident light beam, $X_W$ is a displacement of the wafer with respect to the incident light beam, and A and B are constants.

Thus, the phase difference $\Delta\phi_X$ between the light beams of $I_M(0, 1)$ and $I_W(0, 1)$ orders may be given by $$\Delta\phi_X = 2(X_M - X_W)$$
$$= 4\pi/p_x \cdot (X_M - X_W).$$

The phase difference $\Delta\phi_X$ is a function which does not include the gap distance Z but includes only the displacements $X_M$ and $X_W$. Accordingly, the displacement can be independently determined without regard to the gap distance by measuring the phase difference $\Delta\phi_X$.

In FIGS. 18A–18D, the displacement $\Delta x$ ($=X_M - X_W$) between a mask and a wafer is plotted against the axis of the abscissa, while the phase difference $\Delta$ is plotted against the ordinate axis.

In FIGS. 18A–18D, the pitch $P_X$ of the diffraction grating is 5 μm. FIG. 18A shown the case where the gap between the mask and the wafer is 25 μm, FIG. 18B shows the case where the gap between the mask and the wafer is 30 μm, FIG. 18C shows the case where the gap between the mask and the wafer is 35 μm, and FIG. 18D shown the case where the gap between the mask and the wafer is 40 μm.

As is clear from FIGS. 18A–18D, the displacement $\Delta x$ is measured without reference to the value of the gap. Therefore, the relative position between the mask and the wafer can be adjusted with high accuracy such that the relation $\Delta\phi_X$ is satisfied. It should be noted that values of the gap shown in FIGS. 18A–18D are no more than examples; the present invention is in no way limited to such values.

In the present embodiment, as is evident from the above description, the light beams of $I_M(0, 1)$, $I_W(0, 1)$, and $I_G(1, 1)$ orders can be independently selectively detected. Thus, these light beams can be highly accurately aligned with one another without regard to the gap distance between the mask and the wafer, and the gap distance can be set with high accuracy without regard to the presence of the displacement between the mask and the wafer.

In the present embodiment, moreover, the alignment and gap setting are simultaneously effected by means of the two light beams 1 and 2 individually having the frequencies f1 and f2. In contrast with the conventional case, therefore, it is unnecessary to use three light beams, so that an arrangement for supplying the light beams is simple.

According to the present invention, moreover, the phase of each diffracted light beam, not its intensity, is measured. If the reflectivity of the diffraction gratings changes, in the process of manufacturing a semiconductor device, the amplitude of the intensity of each diffracted light beam also change, but its phase does not change. Thus, the arrangement of the invention is not influenced by the change of the reflectivity of the diffraction gratings, which is attributable, for example, to resist coating on the wafer surface, so that it can ensure high-accuracy measurement.

Figure 6:
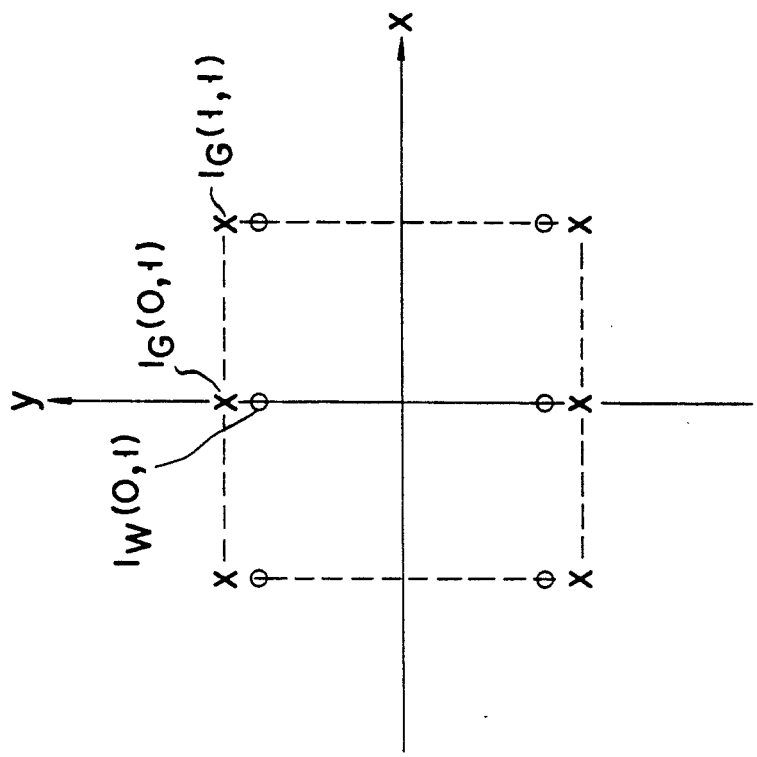
FIG. 6 is a diagram showing two-dimensional distribution of diffracted interference light beams diffracted and caused to interfere with each other by the diffraction gratings shown in FIG. 5.
Figure 5:
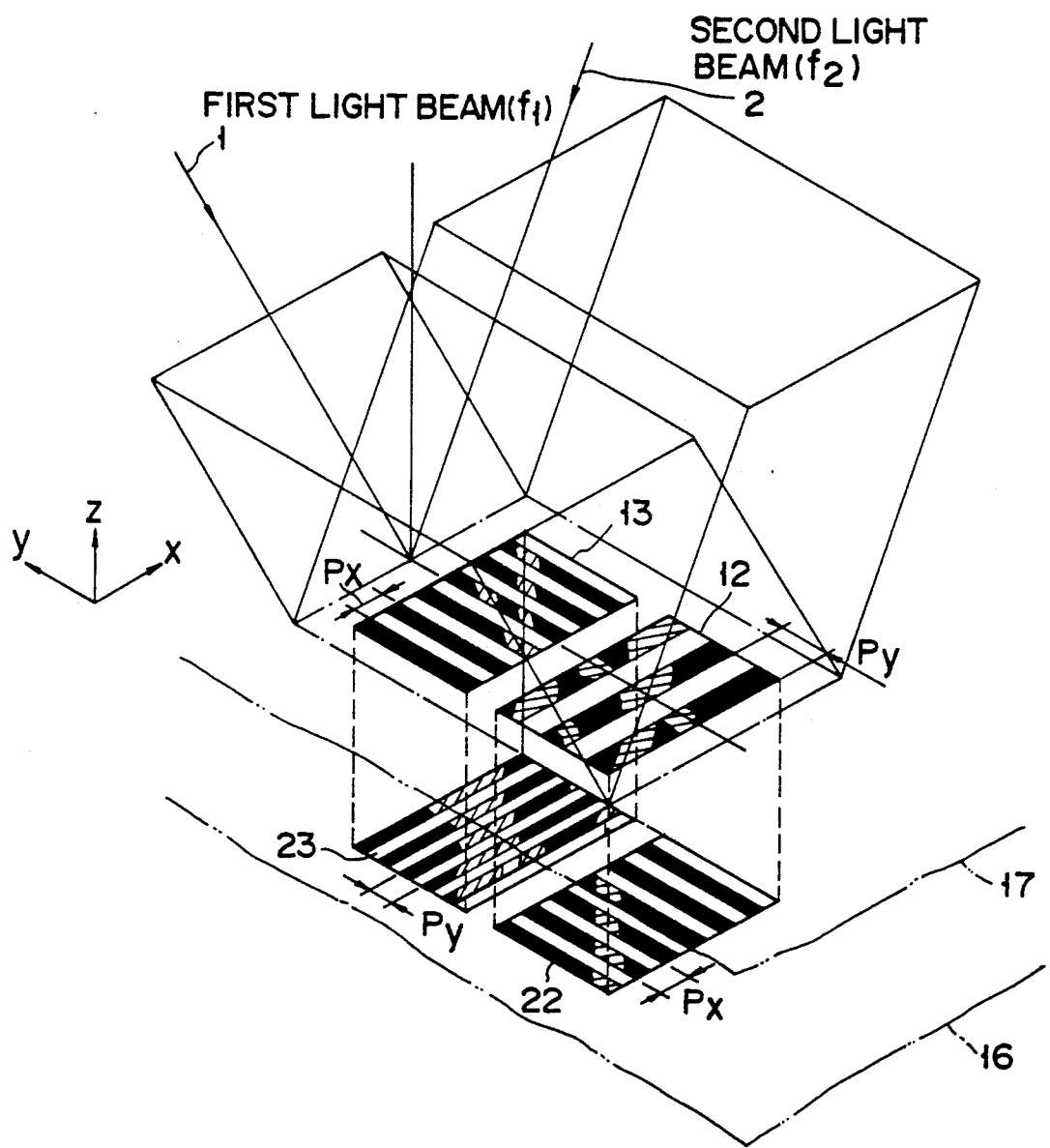
FIG. 5 is a schematic perspective view showing diffraction gratings of a mask and a wafer according to a first modification of the embodiment of the invention.

Referring now to FIGS. 5 and 6, a first modification of the aforementioned embodiment will be described.

In this modification, the mask 17 and the wafer 16 are formed with only two regions each. More specifically, a one-dimensional diffraction grating is formed in each of the regions 13 and 23, as in the case of the above embodiment, and a one-dimensional diffraction grating is also formed in each of the regions 12 and 22.

Also in this case, the second diffracted interference light beams $I_W$, diffracted via the regions 12 and 22 and again via the region 12, and the first diffracted interference light beams $I_G$, diffracted via the regions 13 and 23 and again via the region 13, appear distributed two-dimensionally.

First, diffracted light beams of $I_W(0, 1)$ and $I_G(1, 1)$ orders are used for the gap setting, and the phase difference and gap distance are measured in the aforementioned manner.

Diffracted light beams of $I_W(0, 1)$ and $I_G(0, 1)$ orders are used for the alignment. In this case, the one-dimensional grating of the region 23 of the wafer 16 extends in the x-direction. Even if the region 23 is deviated in the x-direction or the direction of alignment, therefore, the diffracted light beam of $I_G(0, 1)$ order does not change its phase, and never contains x-direction displacement information on the wafer. The one-dimensional diffraction grating of the region 13 of the mask 17, on the other hand, extends in the y-direction. If the region 13 is deviated in the x-direction, therefore, the diffracted light beam of $I_G(0, 1)$ order changes its phase, so that it contains only x-direction displacement information on the mask.

Likewise, the one-dimensional diffraction grating of the region 12 of the mask 17 extends in the x-direction, while the one-dimensional diffraction grating of the region 22 of the wafer 16 in the y-direction. Therefore, the diffracted light beam of $I_W(0, 1)$ order contains no displacement information on the mask, but contains only x-direction displacement on the wafer.

Thus, the displacement between the mask and the wafer can be measured by detecting the phase difference between the light beams of $I_G(0, 1)$ and $I_W(0, 1)$ orders.

In this modification, moreover, the respective one-dimensional diffraction gratings of the regions 13 and 23 define a two-dimensional diffraction grating in cooperation with each other, and the respective one-dimensional diffraction gratings of the regions 22 and 23 also define one. Accordingly, $I_G$ and $I_W$ can appear distributed two-dimensionally. Since the y-direction pitches of the diffraction gratings of the regions 12 and 23 are different, furthermore, $I_G$ and $I_W$ can appear differently in the y-direction.

Also in this modification, therefore, the light beams of $I_W(0, 1)$, $I_G(1, 1)$, and $I_G(0, 1)$ orders can be detected selectively and separately from one another. Further, the gap between the mask and the wafer can be measured without regard to the presence of the displacement between the two, and the displacement can be measured without depending on the gap distance between the two.

According to the present invention, as described in connection with the above modification, the mask and the wafer need not always be formed with three regions each. If they are provided with at least two regions each, the measurements of the displacement and the gap distance between the mask and the wafer, or the alignment and the gap setting between the two, can be simultaneously effected.

Figure 7:
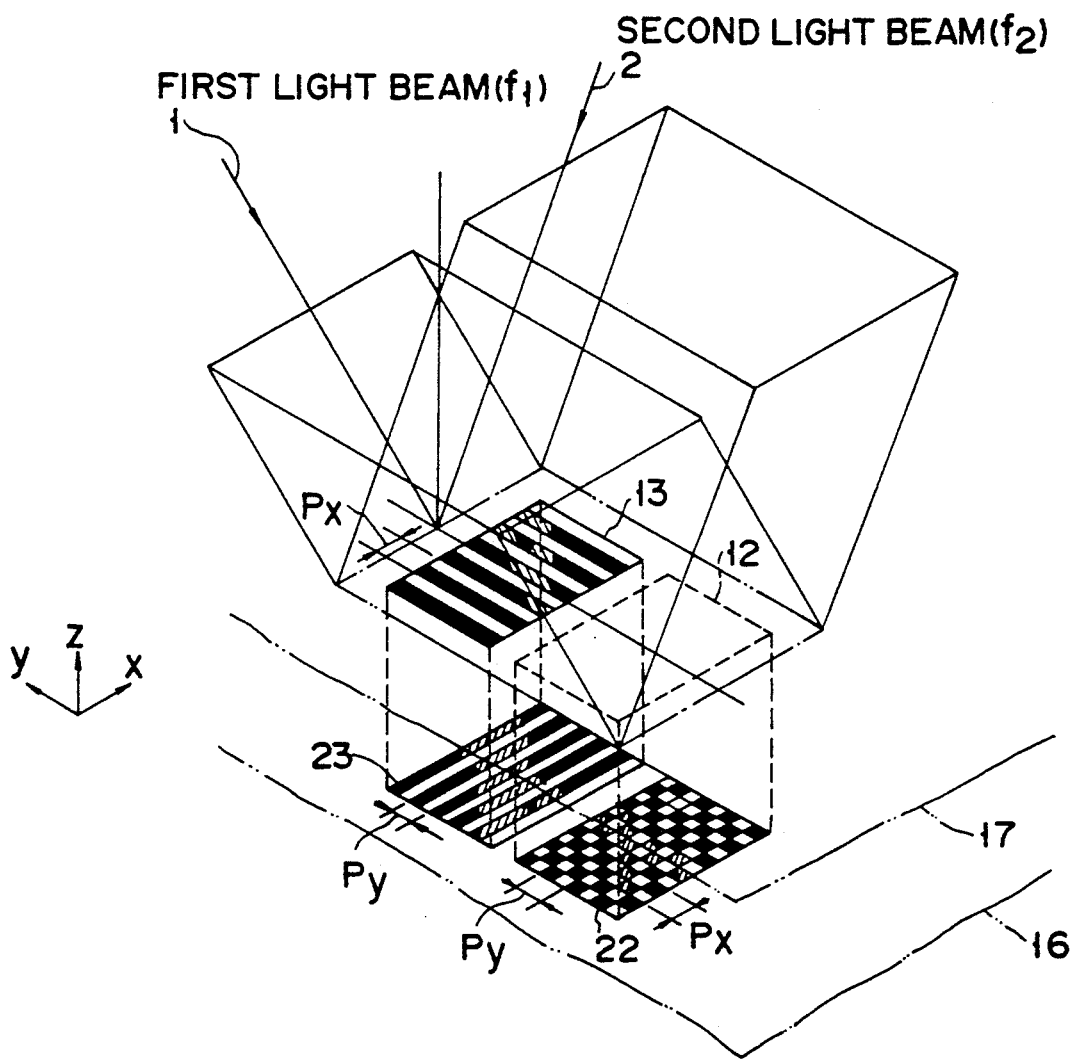
FIG. 7 is a schematic perspective view showing diffraction gratings of a mask and a wafer according to a second modification of the embodiment of the invention.
Figure 8:
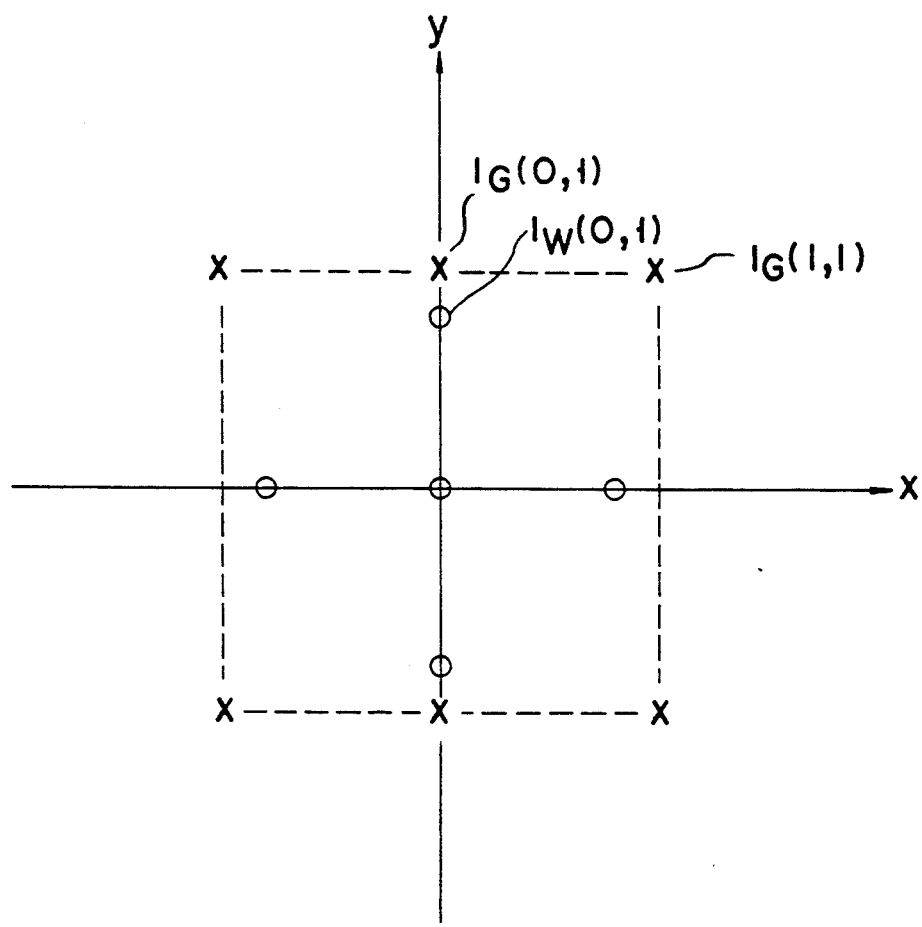
FIG. 8 is a diagram showing two-dimensional distribution of diffracted interference light beams diffracted and caused to interfere with each other by the diffraction gratings shown in FIG. 7.

Referring now to FIGS. 7 and 8, a second modification of the aforementioned embodiment will be described.

In this modification, a transparent screen or window is disposed in the region 12, and a checkered-pattern diffraction grating in the region 22. Also in this case, the second diffracted interference light beams $I_W$, diffracted via the regions 12 and 22 and again via the region 12, appear distributed two-dimensionally. The light beams $I_W$, which are diffracted only by the checkered-pattern diffraction grating of the region 22 of the wafer, contain only displacement information on the wafer. Thus, the displacement between the mask and the wafer can be determined by detecting the phase difference between the diffracted light beam of $I_W(0, 1)$ order, out of the light beams $I_W$, and the diffracted light beam of $I_G(0, 1)$ order, out of the first diffracted interference light beams $I_G$ emerging from the regions 12 and 13.

As in the case of the foregoing modification, the diffracted light beams of $I_G(1, 1)$ and $I_W(0, 1)$ are used for setting the gap between the mask and the wafer.

Also in this modification, the light beams of $I_G(1, 1)$, $I_G(0, 1)$, and $I_W(0, 1)$ orders can be detected selectively and separately from one another, as shown in FIG. 8. Further, the gap between the mask and the wafer can be measured without regard to the presence of the displacement between the two, and the displacement can be measured without regard to the gap distance between the two. If the mask and the wafer are provided with at least two regions each, moreover, the alignment and the gap setting between them can be simultaneously effected.

In the embodiment described above, the diffracted light beams of $I_G(1, 1)$ and $I_W(0, 1)$ are used for the gap setting. Alternatively, however, high-order diffracted light beams, e.g., ones of $I_G(n, r)$ and $I_W(0, r)$ orders (where n and r are arbitrary integers), may be used for the purpose. Likewise, although the diffracted light beams of $I_G(0, 1)$ and $I_W(0, 1)$ are used for the alignment, high-order diffracted light beams, e.g., ones of $I_G(0, r)$ and $I_W(0, r)$ orders (where n and r are arbitrary integers), may be used instead.

Further, the corresponding pairs of regions of the mask and the wafer are not limited to the aforementioned combinations. In short, it is necessary only that at least one diffraction grating be provided so that the light beams are emitted as two-dimensionally distributed diffracted light beams after passing through the paired regions of the mask and the wafer. Diffraction gratings of various types may be used for this purpose.

FIGS. 9 to 12 show a diffraction grating which can emit two-dimensionally distributed diffracted interference light beams.

If a two-dimensional diffraction grating or checkered-pattern diffraction grating and a mirror surface are disposed in the region 11 of the mask and the region 21 of the wafer, respectively, as shown in FIG. 9, the diffracted light beams are distributed two-dimensionally as illustrated.

Figure 10:
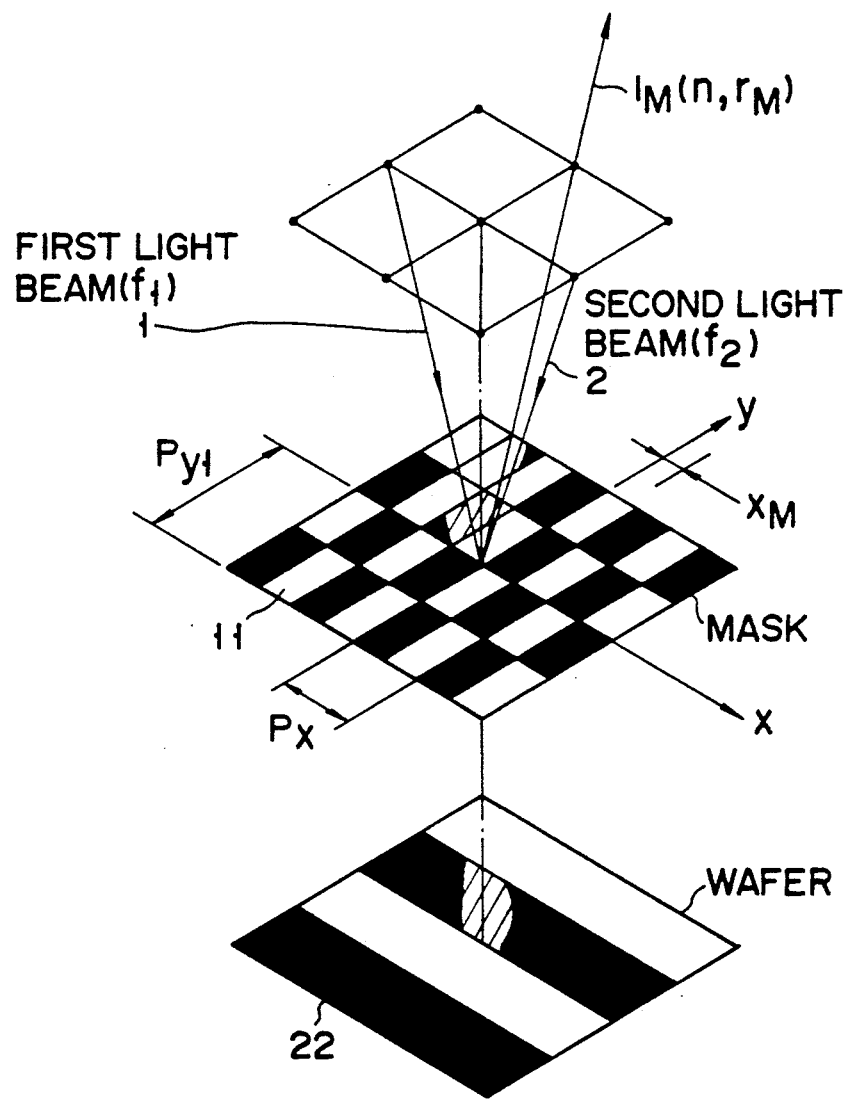
Figure 11:
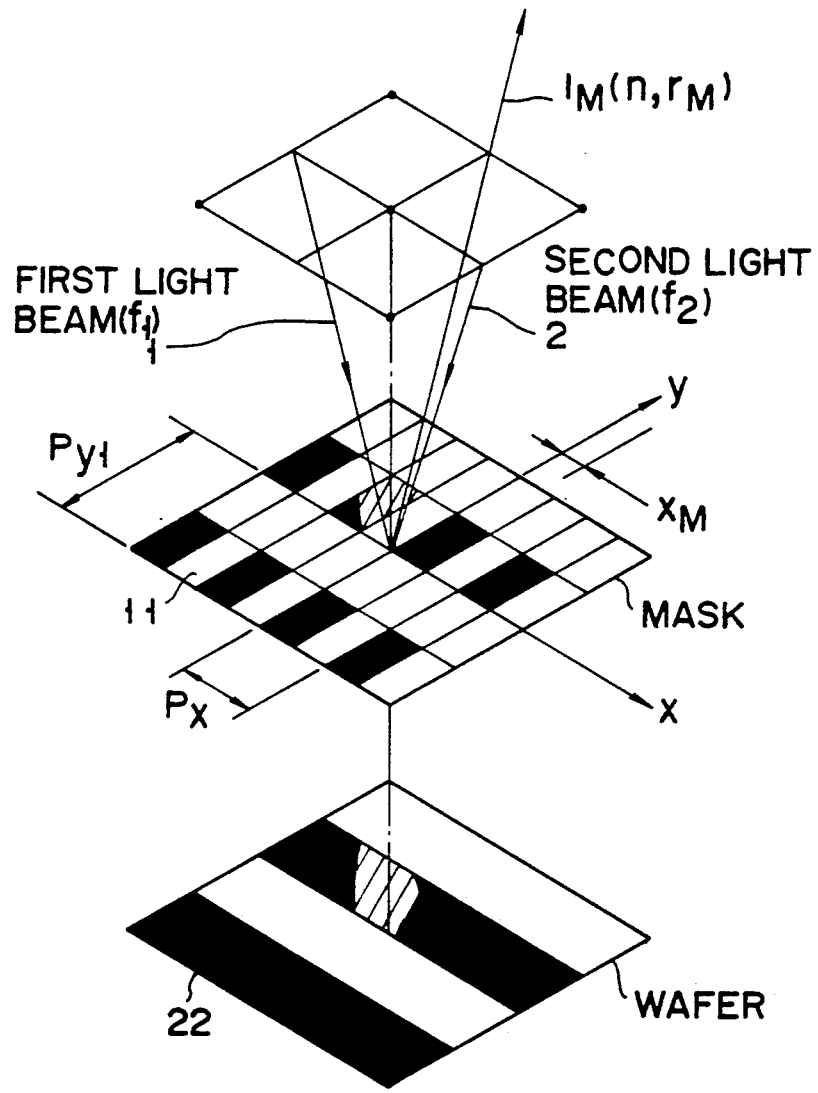
Figure 12:
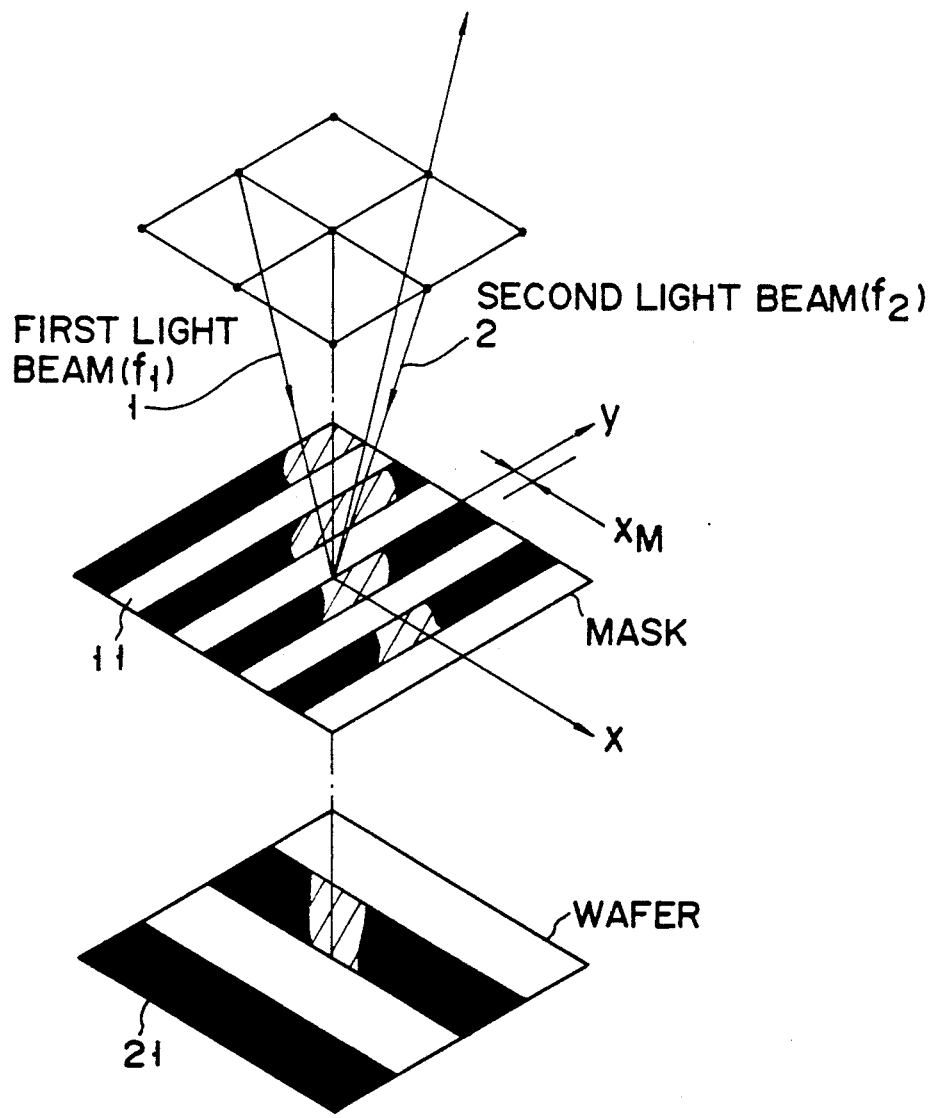

Also if a checkered-pattern diffraction grating and a one-dimensional diffraction grating are disposed in the region 11 of the mask and the region 21 of the wafer, respectively, as shown in FIGS. 10 and 11, the diffracted light beams are distributed two-dimensionally. As shown in FIG. 12, moreover, if a one-dimensional diffraction grating is disposed in each of the mask region 11 and the wafer region 21, the diffracted light beams are also distributed two-dimensionally.

Further, if a window and a checkered-pattern diffraction grating are disposed in the region 11 of the mask and the region 21 of the wafer, respectively, the diffracted light beams are naturally distributed two-dimensionally (not shown).

Accordingly, the diffraction gratings disposed in the regions 11 (or 13) and 12 of the mask and the regions 21 (or 23) and 22 of the wafer may be combined in the manners shown in FIGS. 13 to 16.

As shown in FIGS. 13a to 13d, a checkered-pattern diffraction grating may be disposed in each of the region 11 or 13 of the mask and the region 22 of the wafer. The aforementioned pitches are used in this case.

As shown in FIGS. 14a to 14d, moreover, a one-dimensional diffraction grating, having a striped pattern extending in the x-direction, may be disposed in the region 21 or 23 of the wafer, besides the arrangement of FIG. 13.

As shown in FIGS. 15a to 15d, a one-dimensional diffraction grating having a striped pattern extending in the y-direction, another one-dimensional diffraction grating having a striped pattern extending in the x-direction, and a checkered-pattern diffraction grating may be disposed in the region 11 or 13 of the mask, the region 21 or 23 of the wafer, and the region 22 of the wafer, respectively. The y-direction pitch $p_{y3}$ of the one-dimensional diffraction grating of the region 21 or 23 should be different from the y-direction pitch $p_{y1}$ of the checkered-pattern diffraction grating of the region 22.

In each of the cases shown in FIGS. 16a to 16d, the striped pattern of the one-dimensional diffraction grating of the region 21 extends in the y-direction, compared with the striped pattern of FIG. 14 which extends in the x-direction.

As described above, there may be 16 possible combinations of diffraction gratings in four groups to provide the two-dimensionally distributed diffracted light beams. The combination of checkered-pattern diffraction gratings shown in FIG. 13a is best suited for the purpose, since the amplitude of the beat signals is the greatest (four times as great as the minimum amplitude) in this case.

According to the embodiment described above, the present invention is applied to a life-size X-ray exposure apparatus. However, the present invention is not limited to this embodiment, and may be also applied, for example, to a reduced-scale projection exposure apparatus of an X-ray reflection type, in which an X-ray reflection optical system is disposed between a mask and a wafer, and a reduced-scale projection exposure apparatus which uses infrared-beams, γ-rays, excimer laser beams, etc. and in which a projection lens is interposed between a mask and a wafer.

Further, the optical path of the incident light beam is not limited to the one extending from the transmission-type mask to the reflection-type wafer, and may alternatively be one extending from a transmission-type wafer to a reflection-type mask or from a transmission-type mask to a transmission-type wafer. If the gap between the mask and the wafer is large, an optical path extending from a reflection-type wafer to a transmission-type mask may be used.

Figure 17:
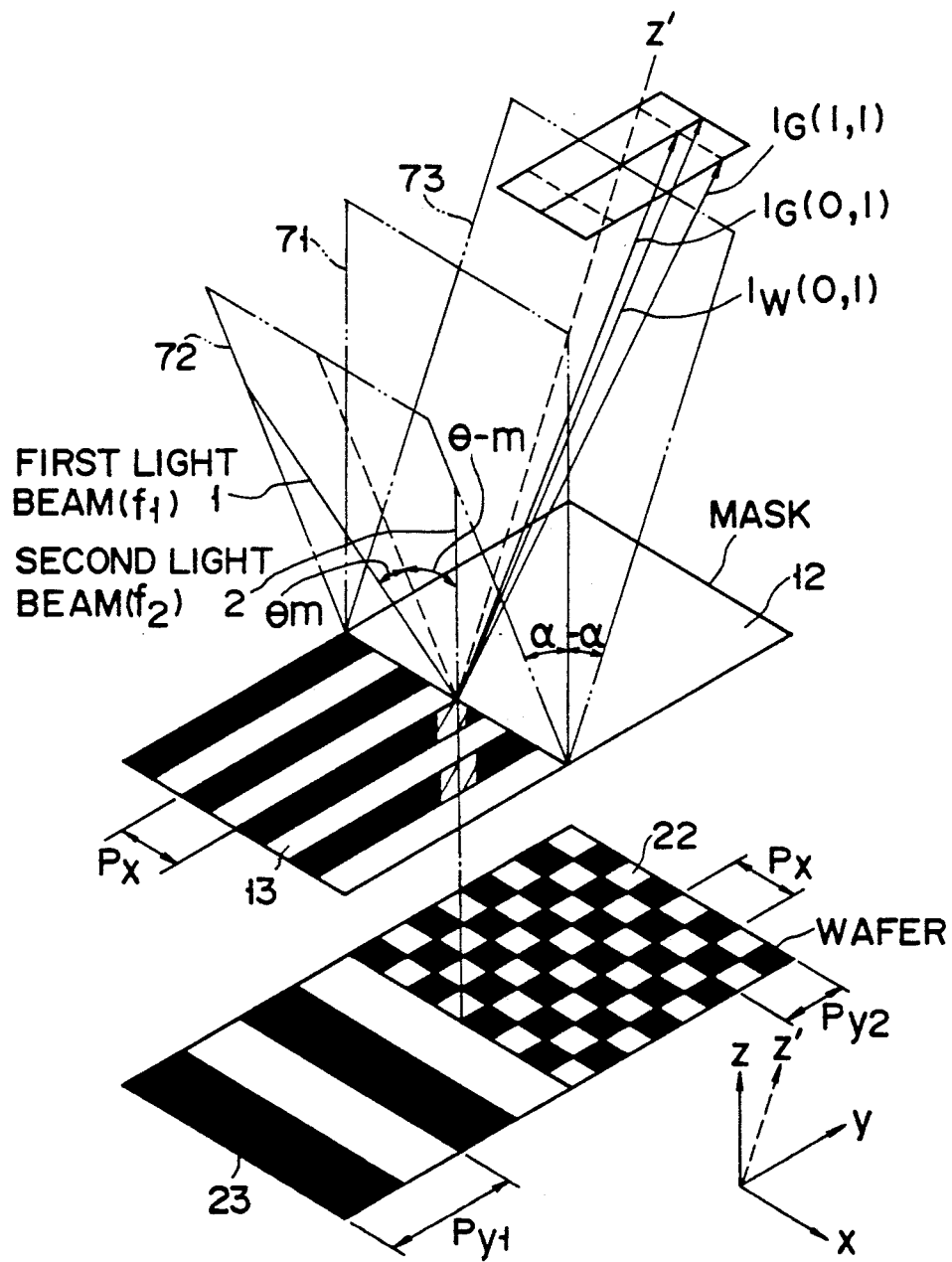
FIG. 17 is a schematic view showing a modification of the way of incidence of incident light beams.

Furthermore, the two incident light beams having the frequencies f1 and f2 need not be symmetrically incident with respect to a plane perpendicular to the mask. Alternatively, the light beams may be diagonally incident on the mask along a second imaginary plane 72 which extends at an angle to a first imaginary plane 71 perpendicular to the mask, as shown in FIG. 17. In this case, the diffracted light beams are two-dimensionally distributed with respect to a z'-axis on a third imaginary plane 73, the first and third imaginary planes 71 and 73 being symmetrical with respect to the vertical imaginary plane 71.

The present invention may be also applied to the measurement of a displacement and a gap distance between two objects in any other apparatuses than semiconductor manufacturing apparatuses.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for measuring a displacement between first and second objects facing each other with respect to a direction perpendicular to the direction in which the objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing a light beam, which is emitted after being transferred to corresponding regions of the first and second objects, into two-dimensionally distributed diffracted light beams, said method comprising the steps of:

emitting a first light beam having a frequency f1 and a second light beam having a frequency f2 (f1≠f2) from light source means, which is arranged so as to face the second object, with the first object located between said light source means and said second object;

transferring the first and second light beams to the first and second regions of the first object, and then causing the first and second light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

detecting a light beam of a specific order from the first diffracted interference light beam and converting the detected light beam into a first beat signal having a frequency of $\Delta f$, where $\Delta f = |f1 - f2|$, and further detecting a light beam of an order identical with or different from said specific order, from the second diffracted interference light beam and converting the detected light beam into a second beat signal having said frequency ($\Delta f$); and calculating a phase difference between the first and second beat signals and deriving the displacement between the first and second objects from the calculated phase difference.

2. The displacement measuring method according to claim 1, wherein the regions of each said object are arranged along the y-axis of a two-dimensional coordinate system whose x-axis extends in the direction of the displacement and whose y-axis extends at right angles to the x-axis on the same plane therewith, and said two light beams of the specific order are diffracted light beams of (n, r) order, where n is 0 or an integer, and r is an integer.

3. The displacement measuring method according to claim 2, wherein said diffracted light beams of (n, r) order are diffracted light beams of (0, ±1) order.

4. The displacement measuring method according to claim 2, wherein the y-direction pitches of the diffraction gratings in the regions of the first and second objects are different.

5. The displacement measuring method according to claim 2, wherein at least one region of said second object has a one-dimensional diffraction grating with a one-dimensional pattern formed of a plurality of parallel stripes extending in the x-direction so that the emitted diffracted light beams are distributed one-dimensionally, and one region of said first object corresponding to said one region of said second object has a one-dimensional diffraction grating with a one-dimensional pattern formed of a plurality of parallel stripes extending in the y-direction so that the emitted diffracted light beams are distributed one-dimensionally.

6. The displacement measuring method according to claim 1, wherein at least one region of said first object has a two-dimensional diffraction grating so that the emitted diffracted light beams are distributed two-dimensionally, and one region of said second object corresponding to said one region of said first object having the two-dimensional diffraction grating has a reflecting surface.

7. The displacement measuring method according to claim 1, wherein at least one region of said first object has a transmitting surface, and one region of said second object corresponding to said one region of said first object having the transmitting surface has a two-dimensional diffraction grating with a checkered-pattern so that the emitted diffracted light beams are distributed two-dimensionally.

8. The displacement measuring method according to claim 2, wherein a first imaginary plane perpendicular to the y-axis is defined over said at least two regions, a plane inclined at a predetermined angle $\alpha$ to the y-axis is defined as a second imaginary plane, and an axis extends along the second imaginary plane and at right angles to the x-axis; and said two light beams having the frequencies f1 and f2 are transferred along the second imaginary plane to the two regions of the first object in a manner such that the light beams are symmetrical with respect to said axis and are inclined at a predetermined angle ($\pm\theta = \sin^{-1}(\pm m\lambda/p_x)$, where m is an integer, $\lambda$ is the reference wavelength of the two light beams, and $p_x$ is the x-direction pitch of the diffraction grating of either of the regions) to said axis.

9. The method according to claim 1, wherein said first object is an exposure mask, and said second object is a semiconductor wafer.

10. An apparatus for measuring a displacement between first and second objects facing each other with respect to a direction perpendicular to the direction in which the objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing a light beam, which is emitted after being transferred to corresponding regions of the first and second objects, into two-dimensionally distributed diffracted light beams, said apparatus comprising:

light source means for emitting a first light beam having a frequency f1 and a second light beam having a frequency f2 (f1$\neq$f2), said light source means being arranged so as to face the second object, with the first object located between said light source means and said second object;

transfer means for transferring the first and second light beams to the first and second regions of the first object, and then causing the first and second light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

detecting means for detecting a light beam of a specific order from the first diffracted interference light beam and converting the detected light beam into a first beat signal having a frequency of $\Delta f$, where $\Delta f = |f1 - f2|$, and further detecting a light beam of an order identical with or different from said specific order, from the second diffracted interference light beam and converting the detected light beam into a second beat signal having said frequency ($\Delta f$); and calculating means for calculating a phase difference between the first and second beat signals and deriving the displacement between the first and second objects from the calculated phase difference.

11. The displacement measuring apparatus according to claim 10, wherein the regions of each said object are arranged along the y-axis of a two-dimensional coordinate system whose x-axis extends in the direction of the displacement and whose y-axis extends at right angles to the x-axis on the same plane therewith, and said two light beams of the specific order are diffracted light beams of (n, r) order, where n is 0 or an integer, and r is an integer.

12. The displacement measuring apparatus according to claim 11, wherein said diffracted light beams of (n, r) order are diffracted light beams of (0, $\pm$1) order.

13. The displacement measuring apparatus according to claim 11, wherein the y-direction pitches of the diffraction gratings in the regions of the first and second objects are different.

14. The displacement measuring apparatus according to claim 11, wherein at least one region of said second object has a one-dimensional diffraction grating with a one-dimensional pattern formed of a plurality of parallel stripes extending in the x-direction so that the emitted diffracted light beams are distributed one-dimensionally, and one region of said first object corresponding to said one region of said second object has a one-dimensional diffraction grating with one-dimensional pattern formed of a plurality of parallel stripes extending in the y-direction so that the emitted diffracted light beams are distributed one-dimensionally.

15. The displacement measuring apparatus according to claim 10, wherein at least one region of said first object has a two-dimensional diffraction grating so that the emitted diffracted light beams are distributed two-dimensionally, and one region of said second object corresponding to said one region of said first object having the two-dimensional diffraction grating has a reflecting surface.

16. The displacement measuring apparatus according to claim 10, wherein at least one region of said first object has a transmitting surface, and one region of said second object corresponding to said one region of said first object having the transmitting surface has a two-dimensional diffraction grating with a checkered-pattern so that the emitted diffracted light beams are distributed two-dimensionally.

17. The displacement measuring apparatus according to claim 11, wherein a first imaginary plane perpendicular to the y-axis is defined over said at least two regions, a plane inclined at a predetermined angle α to the y-axis is defined as a second imaginary plane, and an axis extends along the second imaginary plane and at right angles to the x-axis; and said two light beams having the frequencies f1 and f2 are transferred along the second imaginary plane to the two regions of the first object in a manner such that the light beams are symmetrical with respect to said axis and are inclined at a predetermined angle $(+\theta = \sin^{-1}(\pm m\lambda/p_x)$, where m is an integer, λ is the reference wavelength of the two light beams, and $p_x$ is the x-direction pitch of the diffraction grating of either of the regions) to said axis.

18. The apparatus according to claim 10, wherein said first object is an exposure mask, and said second object is a semiconductor wafer.

19. A method for measuring a displacement between first and second objects facing each other with respect to a direction perpendicular to the direction in which the objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing a light beam, which is emitted after being transferred to corresponding regions of the first and second objects, into two-dimensionally distributed diffracted light beams, said method comprising the steps of:

emitting a first light beam having a frequency f1 and a second light beam having a frequency f2 (f1≠f2) from light source means, which is arranged so as to face the second object, with the first object located between said light source means and said second object;

transferring the first and second light beams to the first and second regions of the first and second objects, and then causing the first and second light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

detecting a light beam of a specific order from at least one of the two diffracted interference light beams and converting the detected light beam into a beat detection signal which has a frequency of Δf, where Δf = |f1−f2|, and involves a phase shift corresponding to the displacement between the first and second objects;

generating a third light beam having the frequency f1 and a fourth light beam having the frequency f2, said third and fourth light beams interfering with each other and being of the same phase as the first and second light beams before the diffraction;

detecting the third and fourth light beams and converting the detected light beams into a beat reference signal having the frequency Δf and involving no phase shift corresponding to the displacement between the first and second objects; and calculating the phase difference between the direction signal and the reference signal, thereby obtaining the displacement.

20. The displacement measuring method according to claim 9, wherein the regions of each said object are arranged along the y-axis of a two-dimensional coordinate system whose x-axis extends in the direction of the displacement and whose y-axis extends at right angles to the x-axis on the same plane therewith, and said two light beams of the specific order are diffracted light beams of (n, r) order, where n is 0 or an integer, and r is an integer.

21. The displacement measuring apparatus according to claim 20, wherein the y-direction pitches of the diffraction gratings in the regions of the first and second objects are different.

22. The method according to claim 19, wherein said first object is an exposure mask, and said second object is a semiconductor wafer.

23. The displacement measuring method according to claim 19, wherein at least one region of said first object has a two-dimensional diffraction grating so that the emitted diffracted light beams are distributed two-dimensionally, and one region of said second object corresponding to said one region of said first object having the two-dimensional diffraction grating has a reflecting surface.

24. The displacement measuring method according to claim 19, wherein at least one region of said first object has a transmitting surface, and one region of said second object corresponding to said one region of said first object having the transmitting surface has a two-dimensional diffraction grating with a checkered-pattern so that the emitted diffracted light beams are distributed two-dimensionally.

25. An apparatus for measuring a displacement between first and second objects facing each other with respect to a direction perpendicular to the direction in which the objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing a light beam, which is emitted after being transferred to corresponding regions of the first and second objects, into two-dimensionally distributed diffracted light beams, said apparatus comprising:

light source means for emitting a first light beam having a frequency f1 and a second light beam having a frequency f2 (f1≠f2), said light source means being arranged so as to face the second object, with the first object located between said light source and said second object;

transfer means for transferring the first and second light beams to the first and second regions of the first and second objects, and then causing the first and second light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

first detecting means for detecting a light beam of a specific order from at least one of the two diffracted interference light beams and converting the detected light beam into a beat detection signal which has a frequency of $\Delta f$, where $\Delta f = |f1 - f2|$ and involves a phase shift corresponding to the displacement between the first and second objects;

means for generating a third light beam having the frequency f1 and a fourth light beam having the frequency f2, said third and fourth light beams interfering with each other and being of the same phase as the first and second light beams before the diffraction;

second detecting means for detecting the third and fourth light beams and converting the detected light beams into a beat reference signal having the frequency $\Delta f$ and involving no phase shift corresponding to the displacement between the first and second objects; and calculating means for calculating the phase difference between the detection signal and the reference signal, thereby obtaining the displacement.

26. The displacement measuring apparatus according to claim 25, wherein the regions of each of said object are arranged along the y-axis of a two-dimensional coordinate system whose x-axis extends in the direction of the displacement and whose y-axis extends at right angles to the x-axis on the same plane therewith, and said two light beams of the specific order are diffracted light beams of (n, r) order, where n is 0 or an integer, and r is an integer.

27. The displacement measuring apparatus according to claim 26, wherein the y-direction pitches of the diffraction gratings in the regions of the first and second objects are different.

28. The displacement measuring apparatus according to claim 25, wherein at least one region of said first object has a two-dimensional diffraction grating so that the emitted diffracted light beams are distributed two-dimensionally, and one region of said second object corresponding to said one region of said first object having the two-dimensional diffraction grating has a reflecting surface.

29. The displacement measuring apparatus according to claim 25, wherein at least one region of said first object has a transparent screen, and one region of said second object corresponding to said one region of said first object having the transparent screen has a two-dimensional diffraction grating with a checkered-pattern so that the emitted diffracted light beams are distributed two-dimensionally.

30. The apparatus according to claim 25, wherein said first object is an exposure mask, and said second object is a semiconductor wafer.

31. An apparatus for measuring a displacement between first and second objects facing each other with respect to a direction perpendicular to the direction in which the objects face each other and for measuring a gap between the first and second objects with respect to the direction in which the first and second objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing a light beam, which is emitted after being transferred to corresponding regions of the first and second objects, into two-dimensionally distributed diffracted light beams, said apparatus comprising:

light source means for emitting a first light beam having a frequency f1 and a second light beam having a frequency f2 (f1≠f2), said light source means being arranged so as to face the second object, with the first object located between said light source and said second object;

transfer means for transferring the two light beams to the first and second regions of the first and second objects, and then causing the two light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

first detecting means for detecting light beams of any two specific orders from the diffracted interference light beams and converting the detected light beams into two beat displacement detection signals having a frequency of $\Delta f$, where $\Delta f = |f1 - f2|$, the phase shift between said displacement detection signals corresponding to the displacement between the first and second objects;

second detecting means for detecting light beams of any two specific orders from the diffracted interference light beams and converting the detected light beams into two beat gap detection signals having a frequency of $\Delta f$, where $\Delta f = |f1 - f2|$, the phase shift between said gap detection signals corresponding to the gap between the first and second objects; and calculating means for calculating the phase differences between the two displacement detection signals and between the two gap detection signals, thereby obtaining the displacement and the gap distance between the first and second objects on the basis of the calculated phase difference.

32. The apparatus according to claim 31, wherein said first object is an exposure mask, and said second object is a semiconductor wafer.

33. A method for measuring a displacement between first and second objects facing each other with respect to a direction perpendicular to the direction in which the objects face each other, said first object having at least first and second regions, said second object having at least first and second regions which correspond to the first and second regions of the first object, respectively, said first object having a transmitting surface at least in the first region thereof and a diffraction grating at least in the second region thereof, said second object having a diffraction grating at least in the first region thereof, said diffraction gratings of the first and second objects changing light beam, which is emitted after being transferred to corresponding regions of the first and second objects, into two-dimensionally distributed diffracted light beams, said method comprising the steps of:

emitting a first light beam having a frequency f1 and a second light beam having a frequency f2 (f1≠f2) from light source means, which is arranged so as to face the second object, with the first object located between said light source means and said second object;

transferring the first and second light beams to the first and second regions of the first and second objects, and then causing the first and second light beams to be diffracted and interfere with each other in corresponding regions of the first and second objects, thereby to emit at least two two-dimensionally distributed, diffracted interference light beams, said two diffracted interference light beams including a first diffracted interference light beam which is diffracted only in the first region of the second object, and a second diffracted interference light beam which is diffracted at least in the second region of the first object;

detecting light beams of any two specific orders from the diffracted interference light beams and converting the detected light beams into two beat displacement detection signals having a frequency of $\Delta f$, where $\Delta f = |f1 - f2|$, the phase shift between said displacement detection signals corresponding to the displacement between the first and second objects;

detecting light beams of any two specific orders from the diffracted interference light beams and converting the detected light beams into two beat gap detection signals having a frequency of $\Delta f$, where $\Delta f = |f1 - f2|$, the phase shift between said gap detection signals corresponding to the gap between the first and second objects; and calculating the phase shift between the two displacement detection signals and the phase shift between the two gap detection signals, thereby calculating the displacement between the first and second objects and the gap between the first and second objects.

* * * * *